(12) United States Patent
Murray et al.

(10) Patent No.: US 10,785,884 B2
(45) Date of Patent: Sep. 22, 2020

(54) IN-WALL AMPLIFIER AND CONTROLLER HOUSING AND RELATED METHODS

(71) Applicant: 3M1S, LLC, Orlando, FL (US)

(72) Inventors: Jimmy Lee Murray, Orlando, FL (US); Thu Le, San Marcos, CA (US)

(*) Notice: Subject to any disclaimer, the term of this patent is extended or adjusted under 35 U.S.C. 154(b) by 0 days.

(21) Appl. No.: 16/247,044

(22) Filed: Jan. 14, 2019

(65) Prior Publication Data
US 2019/0223304 A1    Jul. 18, 2019

Related U.S. Application Data

(60) Provisional application No. 62/616,731, filed on Jan. 12, 2018.

(51) Int. Cl.
| | | |
|---|---|---|
| *H03F 3/181* | (2006.01) | |
| *H04R 27/00* | (2006.01) | |
| *H04R 3/12* | (2006.01) | |
| *H05K 5/02* | (2006.01) | |
| *H04R 3/00* | (2006.01) | |
| *H05K 5/00* | (2006.01) | |

(52) U.S. Cl.
CPC ........... *H05K 5/0204* (2013.01); *H03F 3/181* (2013.01); *H04R 3/00* (2013.01); *H04R 3/12* (2013.01); *H04R 27/00* (2013.01); *H05K 5/0004* (2013.01); *H05K 5/0017* (2013.01); *H05K 5/0247* (2013.01); *H03F 2200/03* (2013.01); *H04R 2201/021* (2013.01); *H04R 2227/003* (2013.01); *H04R 2227/005* (2013.01); *H04R 2420/07* (2013.01)

(58) Field of Classification Search
CPC .................. H03F 2200/03; H03F 3/181; H04R 2201/021; H04R 2227/003; H04R 2227/005; H04R 2420/07; H04R 27/00; H04R 3/00; H04R 3/12; H05K 5/0004; H05K 5/0017; H05K 5/0204; H05K 5/0247
USPC ... 381/77, 80, 104, 120, 305, 360, 361, 386, 381/395; 181/155; 174/491
See application file for complete search history.

(56) References Cited

U.S. PATENT DOCUMENTS

| | | | | |
|---|---|---|---|---|
| 4,230,905 A | * | 10/1980 | Crum ....................... | H04R 5/02 181/155 |
| 6,389,139 B1 | * | 5/2002 | Curtis ....................... | H04S 3/00 381/104 |
| 9,904,508 B1 | * | 2/2018 | Drinkwater ......... | H04L 65/4069 |

(Continued)

*Primary Examiner* — Vivian C Chin
*Assistant Examiner* — Friedrich Fahnert
(74) *Attorney, Agent, or Firm* — Allen Dyer Doppelt & Gilchrist, PA

(57) ABSTRACT

An in-wall amplifier assembly includes a wireless communication device and an amplifier located inside a first housing configured for in-wall installation, with the amplifier configured to amplify the audio output from the wireless communication device and supply it to external speakers. An AC/DC adapter located in a second housing can be connected thereto to supply DC power to the amplifier and wireless communication device. The wireless communication device can be removably accommodated in a faceplate of the first housing and held in place by a wall plate installed thereover. The amplifier can accept an external audio input from another source and automatically switch the amplified audio output between the output of the wireless communication device and the external audio input.

18 Claims, 5 Drawing Sheets

(56) References Cited

U.S. PATENT DOCUMENTS

| | | | |
|---|---|---|---|
| 2013/0319752 A1* | 12/2013 | Cowles | H02G 3/20 |
| | | | 174/491 |
| 2014/0270235 A1* | 9/2014 | Shin | H04R 27/00 |
| | | | 381/77 |
| 2015/0350785 A1* | 12/2015 | Lam | H05K 5/0204 |
| | | | 381/80 |
| 2016/0233912 A1* | 8/2016 | Thomas | H05K 9/0069 |
| 2018/0063611 A1* | 3/2018 | Hart | H04R 1/025 |
| 2019/0043466 A1* | 2/2019 | Masterson | G10K 11/175 |

* cited by examiner

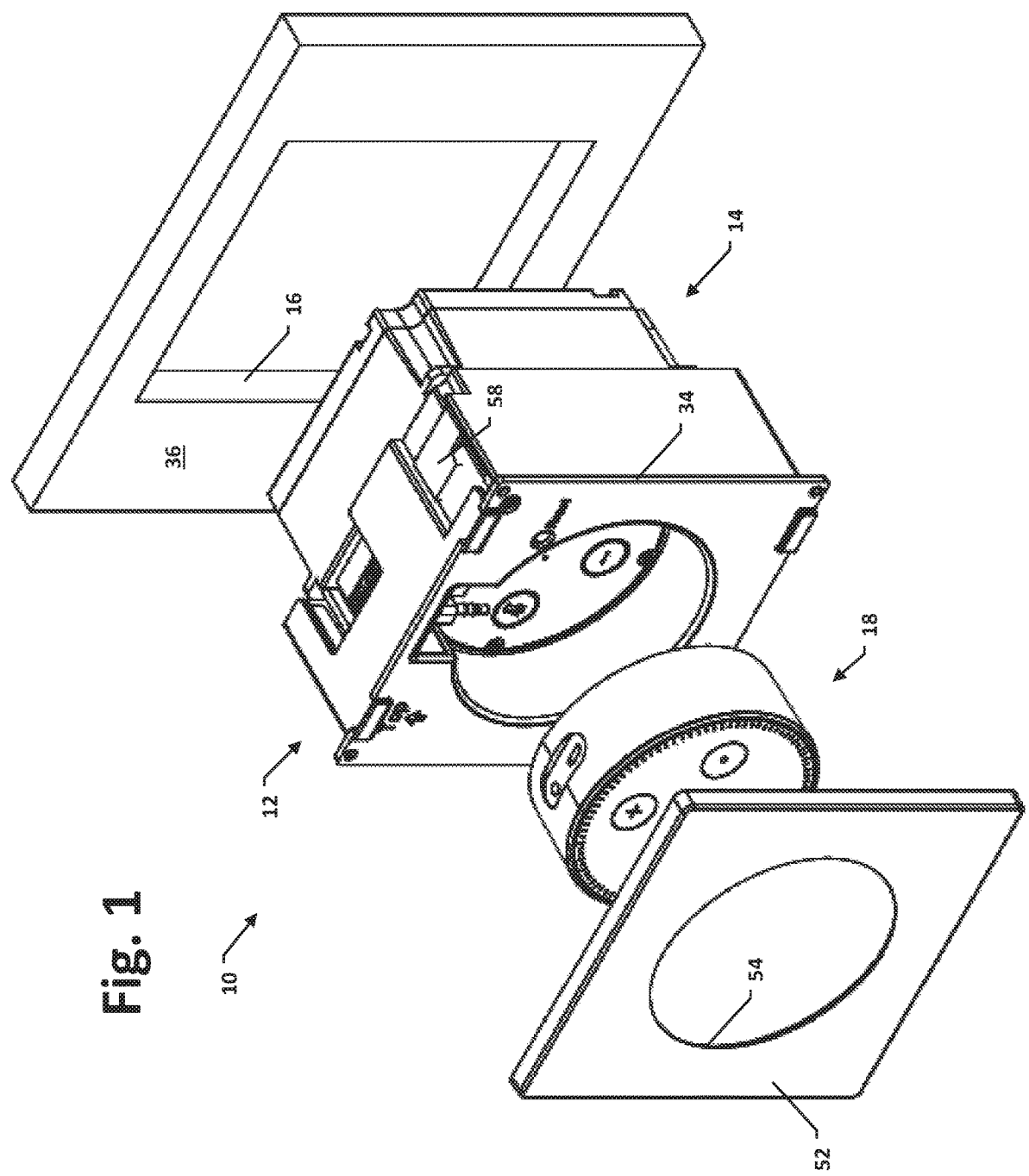

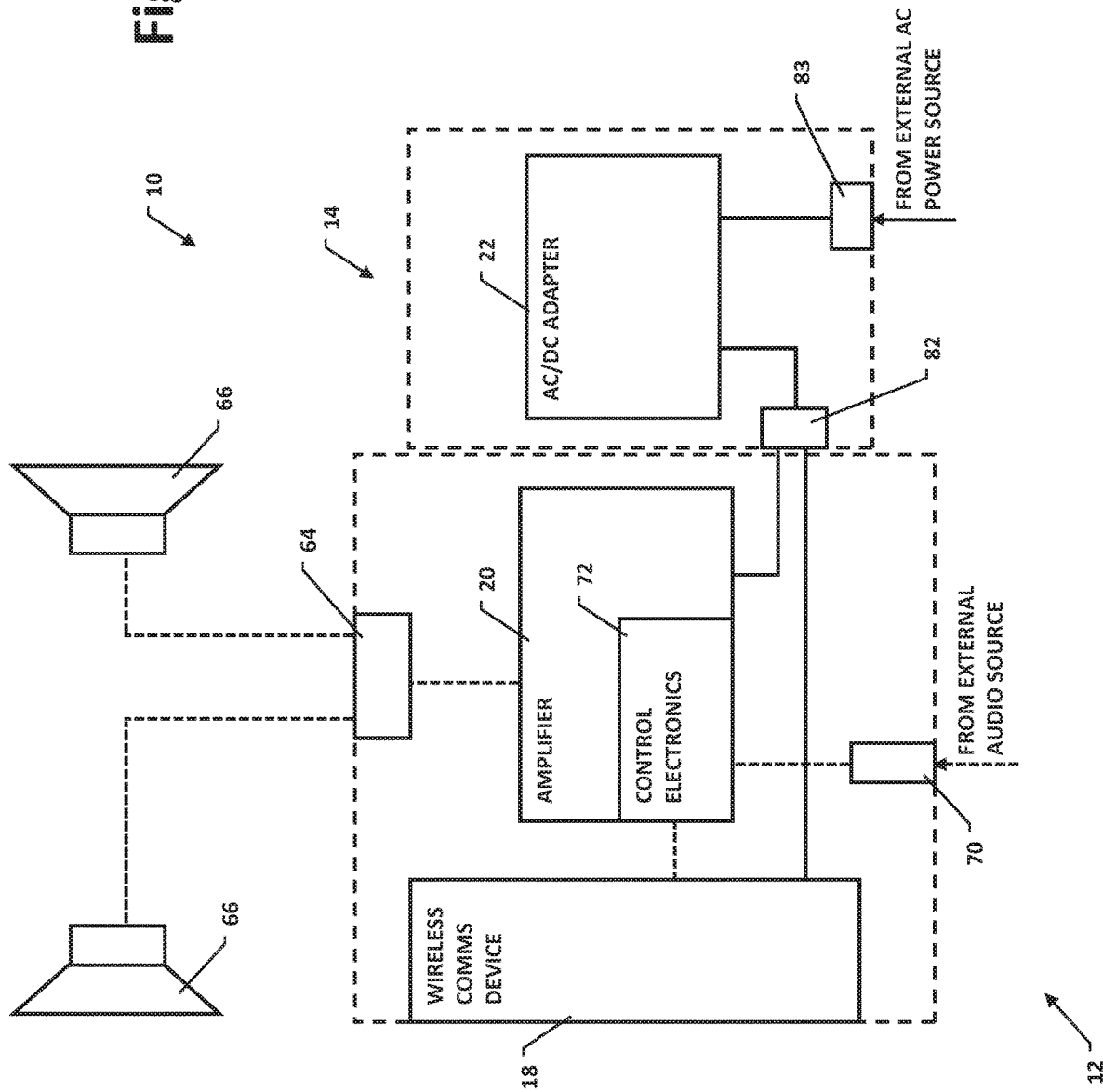

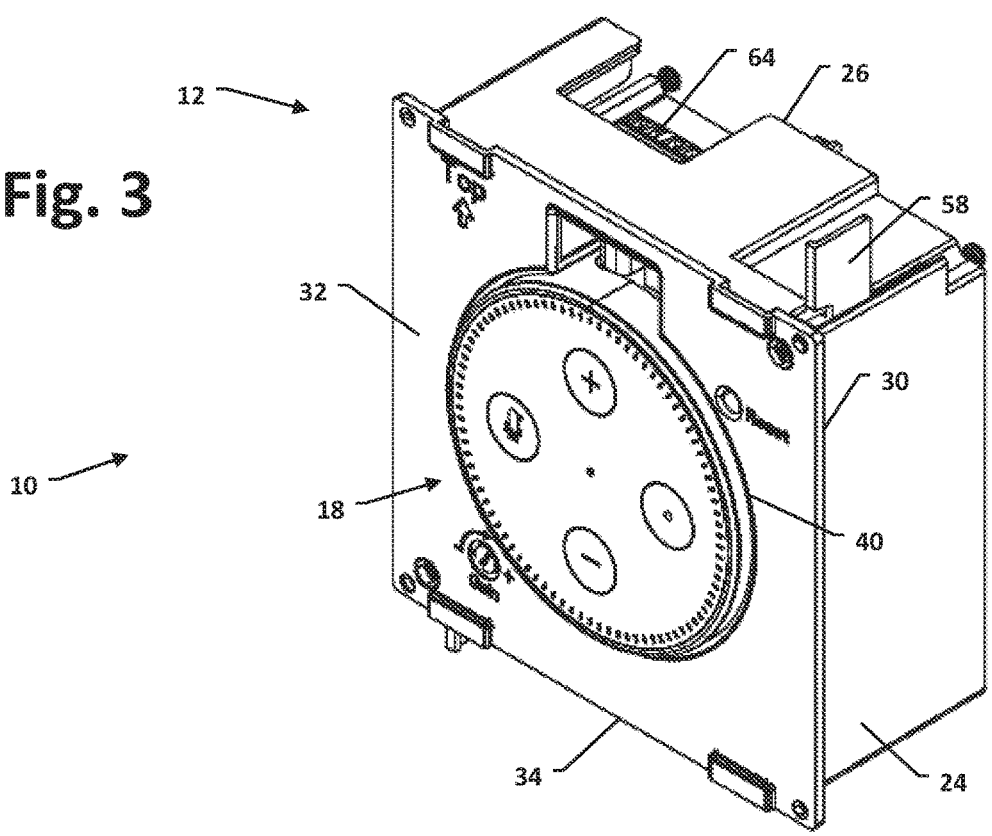
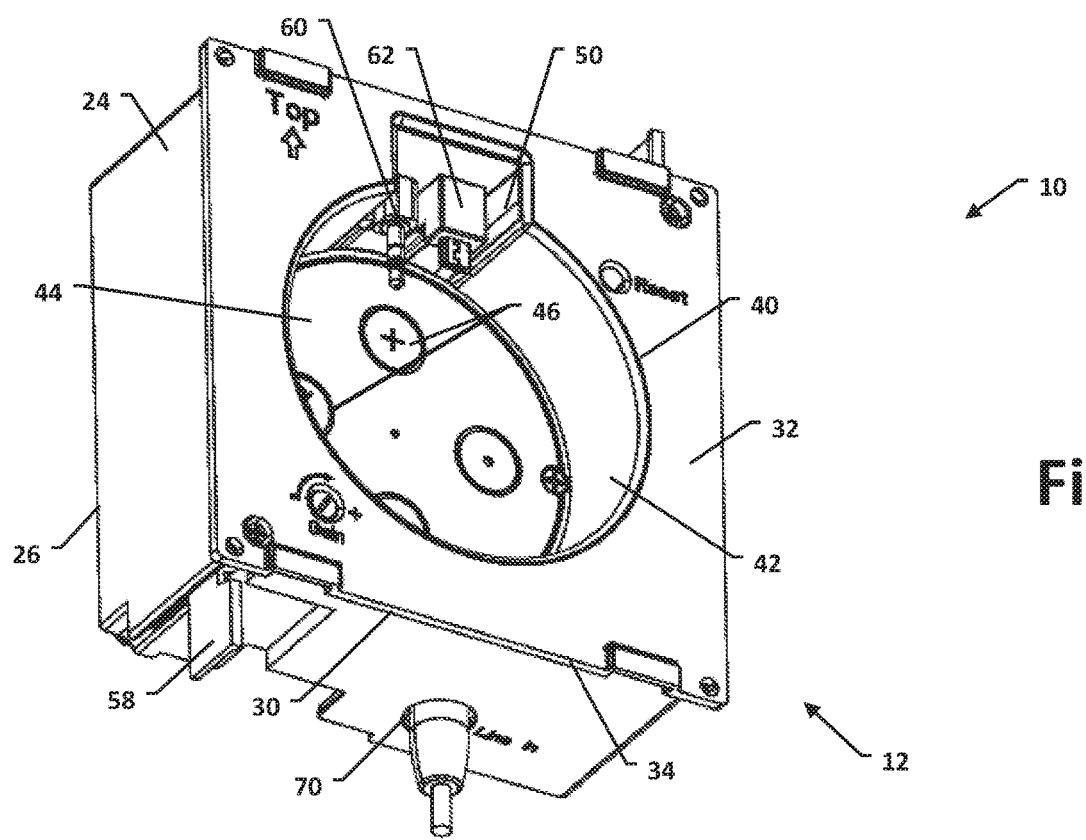

US 10,785,884 B2

IN-WALL AMPLIFIER AND CONTROLLER HOUSING AND RELATED METHODS

CROSS-REFERENCE TO RELATED APPLICATION

This application claims the benefit of U.S. Provisional Patent Application Ser. No. 62/616,731, filed on Jan. 12, 2018, the contents of which are herein incorporated by reference in their entirety.

FIELD OF THE INVENTION

The present invention relates to in-wall distributed audio systems, and more particularly, in-wall distributed audio systems utilizing wireless communication devices.

BACKGROUND OF THE INVENTION

For many home and business owners, an in-wall distributed audio system, that can supply amplified audio to built-in speakers in multiple rooms, is a highly desirable, high-end option. Such a system typically requires multiple specialized components and, in practice, must be installed in a relatively large number of rooms.

The recent development of small, networked wireless communication devices like the Amazon Echo Dot (a trademark of Amazon Technologies, Inc.) or the Google Home Mini (a trademark of Google LLC), allow a sort of distributed audio network—controlled with convenient voice recognition-based controls—to be flexibly introduced simply by adding additional devices to the same wireless network.

However, the volume and/or sound quality available from such devices is often inadequate for the audio preferences of users. Additionally, while relatively small in size, they still lack the extremely low profile, custom look of in-wall systems. Consequently, further improvements are possible.

SUMMARY OF THE INVENTION

In view of the foregoing, it is an object of the present invention to provide an improved in-wall amplifier assembly. According to an embodiment of the present invention an in-wall amplifier assembly comprises connected first and second housings, a wireless communication device and amplifier in the first housing, and an alternating current/direct current (AC/DC) adapter arranged in the second housing.

The first housing at least partially defines a first housing interior volume and includes a first housing sidewall extending between axial inner and outer first housing sidewall ends. The second housing is connected to the first housing and defines a second housing interior volume and includes a second housing sidewall extending between axial inner and outer second housing sidewall ends, a second housing axial inner and outer endwalls extending across the axial inner second housing sidewall ends, respectively.

A flange is connected to at least one of the first and second housing axial outer ends and extends radially beyond a periphery thereof so as to seat against a wall around a periphery of a wall opening with the first and second housings extending axially thereinto.

The wireless communication device is arranged within the first housing interior volume, and is DC powered and configured to generate a wireless communication device audio output. The amplifier is arranged within the first housing interior volume, the amplifier being DC powered and is configured to generate an amplified audio output from at least a first amplifier audio input, the first amplifier audio input being connected to the wireless communication device audio output. An audio output connector is located in the first housing connected to the amplified audio output and is configured to connect to at least one external speaker.

An alternating current (AC) power connection is arranged in the second housing and configured to connect to an AC power source. An AC/DC adapter is also arranged in the second housing, and has an adapter input connected to the AC power connection and an adapter output supplying DC power to the wireless communication device and the amplifier in the first housing.

According to another embodiment of the present invention, an in-wall amplifier assembly for a wireless communication device comprises a first housing with an amplifier arranged therein.

The first housing at least partially defines a first housing interior volume and includes a first housing sidewall extending between axial inner and outer first housing sidewall ends, and a faceplate at least partially covering the first housing axial outer end. A receptacle opening is defined in the faceplate with a receptacle sidewall extending axially into the first housing interior volume from the receptacle opening. The receptacle sidewall at least partially defines a receptacle volume dimensioned to accommodate the wireless communication device therein.

A wall plate is releasably connected to the first housing overlying the faceplate, a receptacle access opening is defined in the wall plate aligned with the receptacle opening, and a radial dimension of the receptacle opening is smaller than a corresponding radial dimension of the receptacle opening, such that the wall plate is able to releasably retain the wireless communication device within the receptacle volume.

Wireless communication device audio output and power connectors extend into the receptacle volume and are configured, respectively, for releasable connection to wireless communication device audio output and power input.

The amplifier is arranged within the first housing interior volume and is configured to generate an amplified audio output from at least a first amplifier audio input. The first amplifier audio input is connected to the wireless communication device audio output connector.

An audio output connector is located in the first housing connected to the amplified audio output and is configured to connect to at least one external speaker. At least one power connection is connected to the amplifier and the wireless communication device power connector and is configured to connect to a power source.

According to a further embodiment of the present invention, an in-wall amplifier assembly for a wireless communication device comprises a first housing with a wireless communication device and an amplifier arranged therein.

The first housing at least partially defines a first housing interior volume and includes a first housing sidewall extending between axial inner and outer first housing sidewall ends. A flange is connected to the first housing axial outer end and extends radially beyond a periphery thereof so as to seat against a wall around a periphery of a wall opening with the first housing extending axially thereinto.

The wireless communication device is arranged within the first housing interior volume, the wireless communication device configured to generate a wireless communication device audio output.

An external audio input connector is located in the first housing, is connected to the second amplifier audio input, and is configured to connect to at least one external audio input.

The amplifier is arranged within the first housing interior volume, and is configured to selectively generate an amplified audio output from the first or second amplifier audio inputs. The first amplifier audio input is connected to the wireless communication device audio output, and the second amplifier audio input is connected to the external audio input connector. The amplifier includes control electronics configured to automatically switch the amplified audio output to the first amplifier audio input when the wireless communication device audio output is detected.

An audio output connector is located in the first housing connected to the amplified audio output and configured to connect to at least one external speaker. At least one power connection is connected to the amplifier and the wireless communication device power connector and is configured to connect to a power source.

These and other objects, aspects and advantages of the present invention will be better appreciated in view the drawings and following detailed description of preferred embodiments.

BRIEF DESCRIPTION OF THE DRAWINGS

FIG. 1 is a partially exploded perspective view of an in-wall amplifier assembly, according to an embodiment of the present invention;

FIG. 2 is a schematic view of the in-wall amplifier assembly of FIG. 1;

FIG. 3 is a perspective view of a first housing of the in-wall amplifier assembly of FIG. 1;

FIG. 4 is a perspective view of the first housing of FIG. 3, with a wireless communication device removed;

DETAILED DESCRIPTION OF PREFERRED EMBODIMENTS

Figure 5:
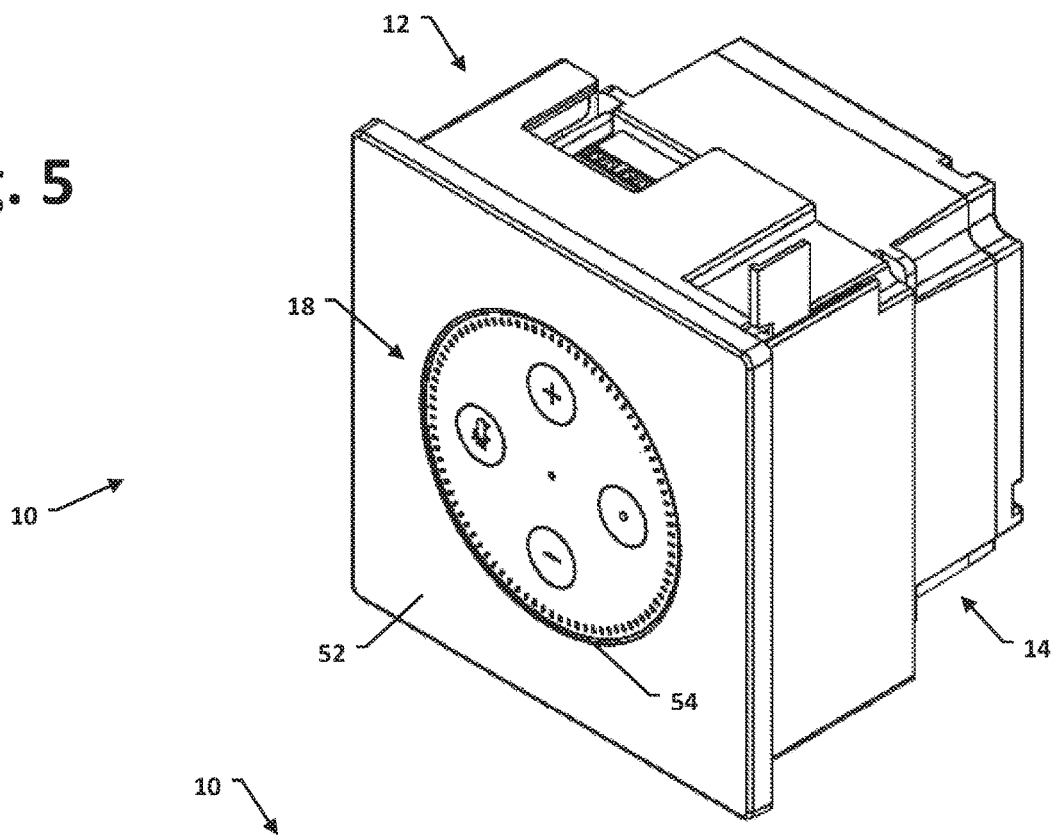
FIG. 5 is a perspective view of the in-wall amplifier assembly of FIG. 1.

Referring to FIGS. 1 and 2, according to an embodiment of the present invention, and in-wall amplifier assembly 10 includes connected first and second housings 12, 14 dimensioned to insert through a wall opening 16. An interior volume of the first housing 12 holds a wireless communication device 18 and an amplifier 20. An interior volume of the second housing includes an alternating current (AC) to direct current (DC) adapter 22.

As used herein, the "axial" direction is the direction in which the assembly 10 is inserted through the wall opening. With reference to the axial direction, "in" and "out" refer to positions that are, respectively, further into (or less far out of) the wall and less far into (or further out of) the wall.

The "radial" direction is any direction perpendicular to the axial direction; for instance, the width and height of the wall opening 16 are both radial dimensions. The reference to a component extending in the radial direction or having a radial extent does not necessarily imply that such a component is circular.

Referring to FIGS. 3 and 4, the first housing 12 has a first housing sidewall 24 extending between inner and outer sidewall ends 26, 30 which partially defines the interior volume of the first housing. The wireless communication device 18 and amplifier 20 are located within the first housing sidewall 24.

A faceplate 32 extends across the axial outer end 30 of the sidewall 24. A flange 34 is formed by a periphery of the sidewall 24 extending radially beyond the first housing sidewall 24. The flange 34 seats against the wall 36 a periphery of the wall opening 16 (see FIG. 1) with the in-wall amplifier assembly 10 fully inserted in the axial direction.

In the depicted embodiment, the wireless communication device 18 is a separate device removably accommodated in the first housing 12—such as the depicted device 18 which can be acquired from Amazon Technologies, Inc., or functionally similar devices available from Google LLC, which entities are unrelated to the current applicant. However, the present invention also encompasses embodiments in which the wireless communication device 18 is implemented on circuitry permanently installed within the first housing 12.

With the removable wireless communication device 18, a receptacle opening 40 is defined in the faceplate 32 with a receptacle sidewall 42 extending axially into the interior volume of the first housing 12 from the opening 40. A receptacle endwall 44 extends across the axial inner end of the receptacle sidewall 42. The receptacle sidewall 42 and endwall 44 define a receptacle volume which closely accommodates the wireless communication device 18.

Indexing marks 46 are formed on the endwall 44 to help identify a correct orientation for placement of the wireless communication device 18 within the receptacle volume. Proper orientation of the device 18 is also facilitated by the connection opening 50 defined in the receptacle sidewall 42, as will be explained in greater detail below.

Figure 6:
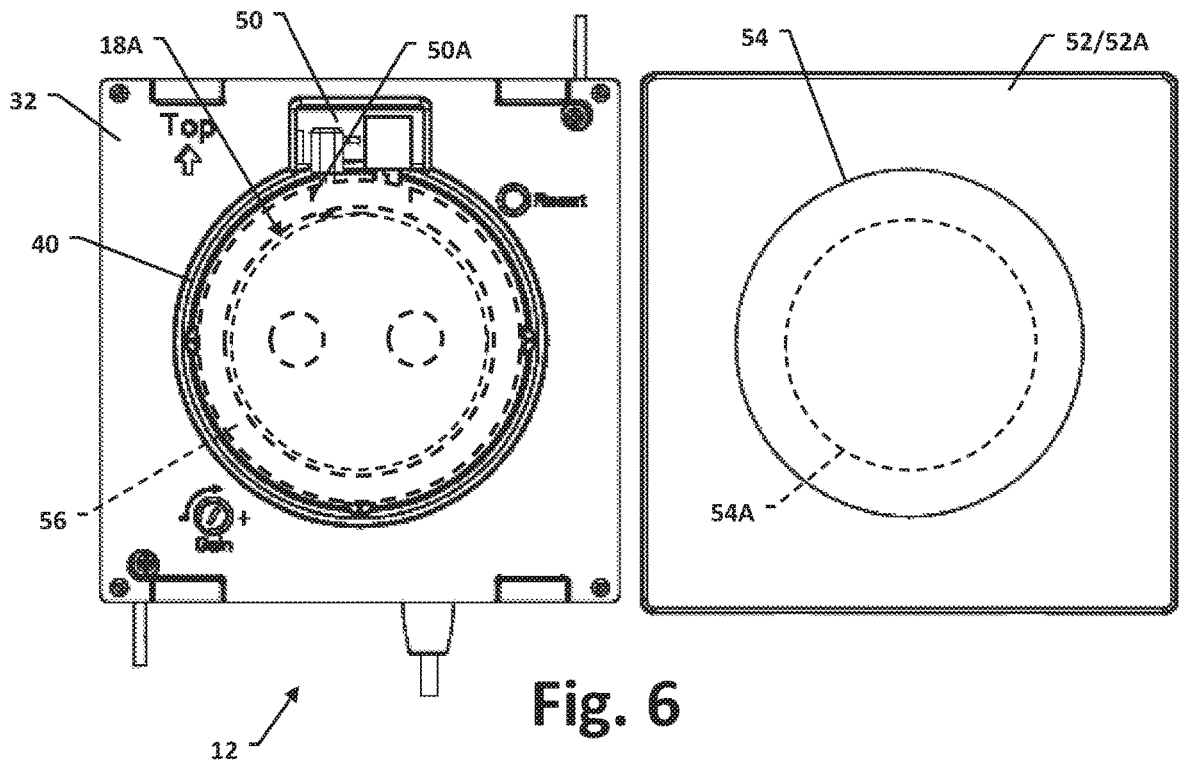
FIG. 6 is a front view of the in-wall amplifier assembly of FIG. 2, with a wall plate shown adjacent thereto and alternate components shown in broken lines.

Referring to FIGS. 5 and 6, a wall plate 52 overlies the faceplate 32. A receptacle access opening 54 is defined in the wall plate 52 which is aligned with the receptacle opening 40. A radial dimension of the access opening 54 in the wall plate 52 is smaller than the corresponding radial dimension of the receptacle opening 40 (and of the wireless communication device 18). With the wall plate 52 in place, the smaller opening 54 ensures the wireless communication device 18 remains retained in the receptacle volume.

To allow wireless communication devices of different dimensions to be accommodated, the receptacle sidewall 42 can include a removable insert 56 around the periphery thereof. With the insert 56 in place, a smaller wireless communication device 18A can be closely accommodated in a reduced receptacle volume. Conversely, with the insert 56 removed, the larger wireless communication device 18 can be accommodated. A connection opening 50A aligned with the connection opening 50 is defined to extend through the corresponding portion of the insert 56.

An alternate wall plate 52A is also supplied with an alternate access opening 54A defined therein that is smaller in radial dimension that the removable insert (and the smaller device 18A). If the insert 56 is used, then the alternate wall plate 52A is used and works just as the wall plate 52, described above. With the insert 56 removed and the larger wireless communication device 18 in place, the wall plate 52 is used.

Referring again to FIGS. 3 and 4, to securely affix the in-wall amplifier assembly 10 inside the wall opening 16, clamps 58 are provided on the first housing 12 that are operable after insertion via connections on the faceplate 32. Deploying and tightening the clamps 58 ensures that the flange 34 remains firmly engaged with the wall 36 around the periphery of the wall opening 16 (see FIG. 1, where clamps 58 are rotated inward to allow insertion/removal). The clamps 58 can be loosened and disengaged if removal of the assembly 10 is desired.

In general, the wireless communication device 18 is configured to connect to a wireless network and, from data received therefrom, generate an audio output. Wireless communication devices equipped with additional functionality (e.g., microphones to recognize user spoken commands) can be used. With the removable device 18, its audio output is releasably connected to an audio output connector 60 which extends through the connection opening 50 of the receptacle sidewall 42. The output connector 60 connects the audio output of the wireless communication device to the amplifier 20.

Power for the removable wireless communication device 18, typically low voltage DC power, is supplied via a releasable power connector 62 also extending through the connection opening 50 of the receptacle sidewall 42. The connection of the device 18 to the connectors 60, 62 further helps ensure the proper orientation within the receptacle volume. In the depicted embodiment, the audio output and power connectors 60, 62 are implemented as separate plugs. It will be appreciated that both connectors could also be implemented on a single plug.

Referring also to FIG. 2, the amplifier 20 is configured to receive wireless communication device 18 audio output as an audio input, amplify the audio input to generate an amplified audio output and supply the amplified audio output to an audio output connector 64 located on the first housing 12. The audio output connector 64 is configured to connect to one or more external speakers 66.

Advantageously, the amplifier 20 is able to receive at least two audio inputs, one from the wireless communication device 18 and the other from an external audio input connector 70 located on the first housing. The external audio input connector 70 allows the in-wall amplifier assembly 10 to also amplify audio signals from a non-networked audio source. For example, the stereo audio output from a television in the room where the in-wall amplifier assembly 10 is installed could be plugged into the connector 70, allowing for amplified audio output via the external speakers 66.

To control switching the amplified audio output between the different audio inputs, the amplifier 20 is preferably equipped with control electronics 72 which are operable to detect the wireless communication device 18 audio output and automatically switch the amplified audio output (and consequently the sound playing through the external speakers 66) to use the device 18 audio output as the active amplifier audio input. When the audio output from the device 18 is no longer detected, the amplified audio output will automatically switch back to the external audio input connector 70. The control electronics 72 can be implemented via an analog or digital circuitry. Additionally, a user control allowing manual switching and/or allowing a user to select between automatic and manual switching could be employed.

As will be appreciated, an in-wall amplifier assembly according to embodiments of the present invention allows a built-in distributed audio system to be quickly and easily installed in a multi-room home, business or other structure by leveraging existing capabilities of wireless communication devices in a unique in-wall architecture. Additionally, as-in the depicted embodiment, an existing separate wireless communication device can simply be used to "plug-and-play" into the in-wall assembly, which further enables other devices in the particular room(s) to utilize the amplifier capabilities of the in-wall assembly.

Figure 7:
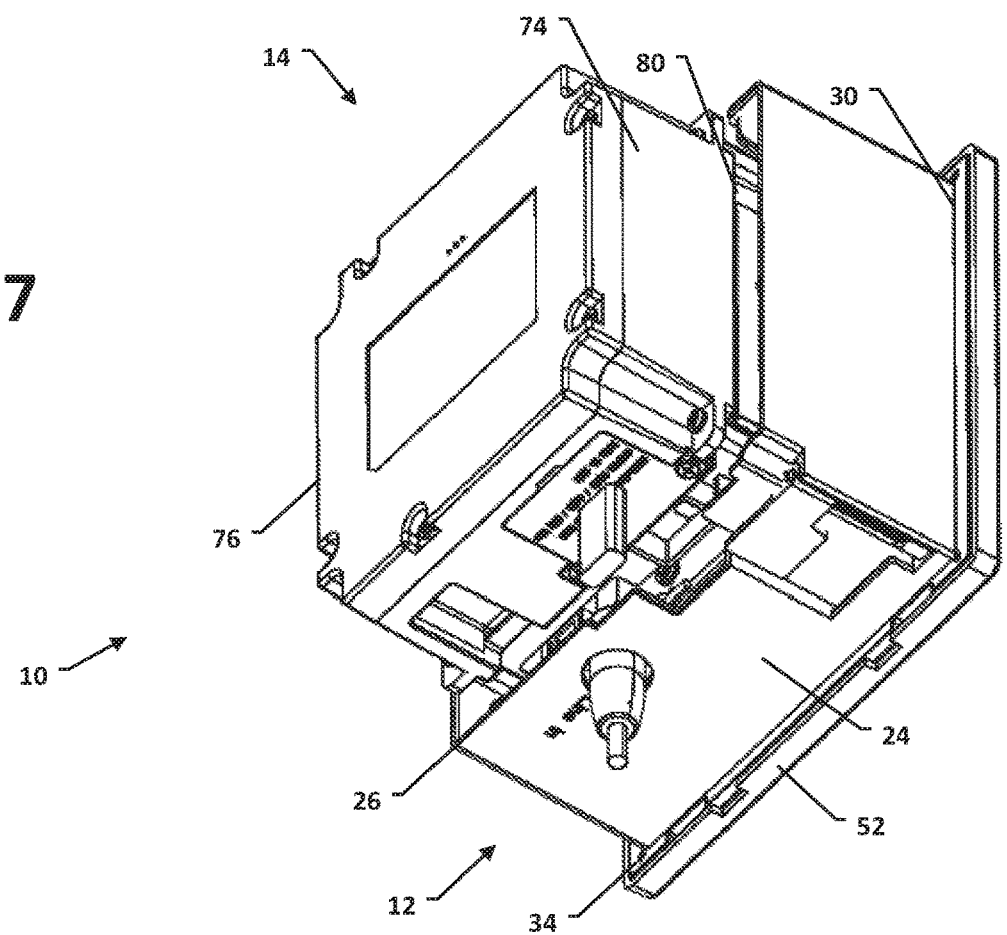
FIG. 7 is another perspective view of the in-wall amplifier assembly of FIG. 1.
Figure 8:
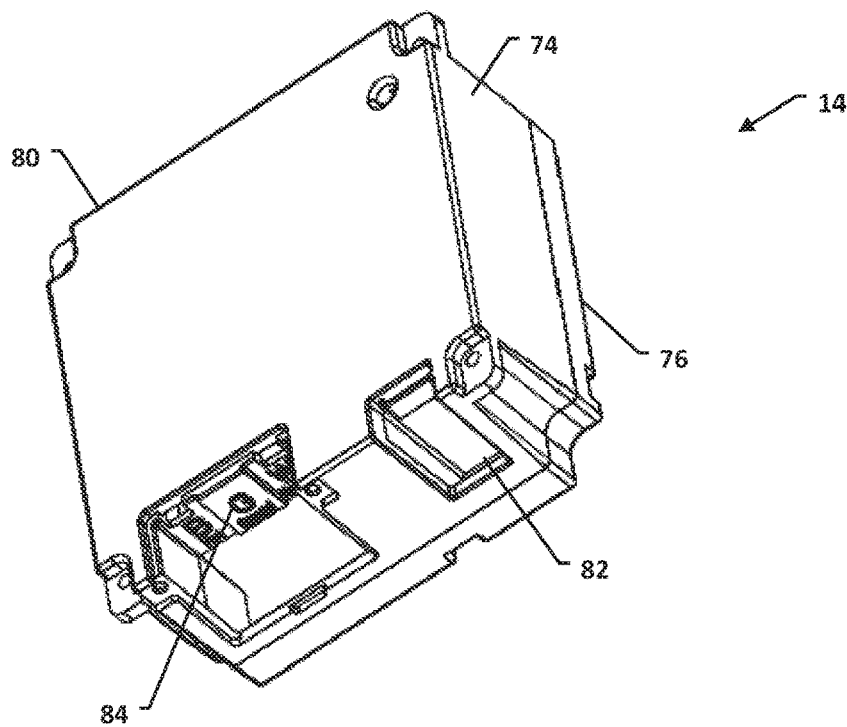
FIG. 8 is a perspective view of a second housing of the in-wall amplifier assembly of FIG. 1.

In the depicted embodiment, the power for the wireless communication device 18 and amplifier 20 are supplied via the AC/DC adapter 22 located in the interior volume of the second housing 14. Referring to FIGS. 7 and 8, the second housing 14 includes a sidewall 74 extending between axial inner and outer sidewall ends 76, 80. The second housing 14 is connected at its axial outer end 80 to the first housing axial inner end 26. The radial dimensions of the second housing sidewall 74 are no larger than those of the first housing sidewall 24, ensuring both can be inserted through the wall opening 16 (see FIG. 1).

The second housing 14 preferably completely encloses its interior volume except where electrical inputs and outputs penetrate. Referring also to FIG. 2, the inputs and outputs include a converter output 82 supplying low voltage DC power to the wireless communication device 18 and the amplifier 20, as well as an AC power input received at an AC power connection 84. Any suitable AC/DC adapter 22 can be used, with the unit typically comprising a transformer, a rectifier and one or more filters and regulators.

By structurally separating the higher voltage AC equipment from the lower voltage wireless communication device and amplifier, the first housing 12 can be made more lightweight and be more easily fabricated, with the attached second housing 14 still providing onboard AC/DC conversion. Alternately, the second housing 14 could be omitted and the wireless communication device 18 and the amplifier 20 could receive suitable DC power directly from one or more external power sources.

In use with only the first housing 12, the overall size of the amplifier assembly 10 can be significantly reduced and can be accommodated within a wall opening having less depth in the axial direction. With smaller wireless communication devices, the assembly can even be dimensioned to fit within a standard double gang electrical box. In a plug-and-play configuration with a suitably dimensioned removable wireless communication device, it may be necessary to locate the wireless communication device radially eccentrically within the double gang box to ensure sufficient room exists to make the power and audio connections to the device within the box.

In general, the foregoing description is provided for exemplary and illustrative purposes; the present invention is not necessarily limited thereto. Rather, those skilled in the art will appreciate that additional modifications, as well as adaptations for particular circumstances, will fall within the scope of the invention as herein shown and described and of the claims appended hereto.

What is claimed is:

1. An in-wall amplifier assembly comprising:
   a first housing at least partially defining a first housing interior volume and including a first housing sidewall extending between axial inner and outer first housing sidewall ends;
   a second housing connected to the first housing and defining a second housing interior volume and including a second housing sidewall extending between axial inner and outer second housing sidewall ends, a second housing axial inner and outer endwalls extending across the axial inner second housing sidewall ends, respectively;

a flange connected to at least one of the first and second housing axial outer ends and extending radially beyond a periphery thereof so as to seat against a wall around a periphery of a wall opening with the first and second housings extending axially thereinto;

a wireless communication device arranged within the first housing interior volume, the wireless communication device being direct current (DC) powered and configured to generate a wireless communication device audio output;

an amplifier arranged within the first housing interior volume, the amplifier being DC powered and configured to generate an amplified audio output from at least a first amplifier audio input, the first amplifier audio input being connected to the wireless communication device audio output;

an audio output connector located in the first housing connected to the amplified audio output and configured to connect to at least one external speaker;

an alternating current (AC) power connection arranged in the second housing and configured to connect to an AC power source; and an AC/DC adapter arranged in the second housing, the AC/DC adapter having an adapter input connected to the AC power connection and an adapter output supplying DC power to the wireless communication device and the amplifier in the first housing;

wherein first housing includes a faceplate at least partially covering the first housing axial outer end, the flange forming a periphery of the faceplate; and wherein a receptacle opening is defined in the faceplate, a receptacle sidewall extends axially into the first housing interior volume from the receptacle opening at least partially defining a receptacle volume, the wireless communication device is removably arranged in the receptacle volume, and a wireless communication device audio output connector and a wireless communication device DC power connector are releasably connected to the wireless communication device in the receptacle volume.

2. The in-wall amplifier assembly of claim 1, wherein a connection opening is defined in the receptacle sidewall, and the wireless communication device audio output connector and DC power connector extend therethrough.

3. The in-wall amplifier assembly of claim 2, wherein a receptacle endwall extends across at least a portion of an axial inner receptacle sidewall end.

4. The in-wall amplifier assembly of claim 1, further comprising a wall plate releasably connected to the first housing overlying the faceplate, a receptacle access opening being defined in the wall plate aligned with the receptacle opening, a radial dimension of the receptacle opening being smaller than a corresponding radial dimension of the receptacle opening, such that the wall plate releasably retains the wireless communication device within the receptacle volume.

5. The in-wall amplifier assembly of claim 1, wherein the amplifier is further configured to generate an amplified audio output from a second amplifier audio input, the in-wall amplifier assembly further comprising an external audio input connector located in the first housing and connected to the second amplifier audio input and configured to connect to at least one external audio input.

6. The in-wall amplifier assembly of claim 1, wherein the amplifier further includes control electronics configured to automatically switch the amplified audio output to the first amplifier audio input when the wireless communication device audio output is detected.

7. An in-wall amplifier assembly for a wireless communication device comprising:

a first housing at least partially defining a first housing interior volume and including a first housing sidewall extending between axial inner and outer first housing sidewall ends and a faceplate at least partially covering the first housing axial outer end, a receptacle opening being defined in the faceplate with a receptacle sidewall extending axially into the first housing interior volume from the receptacle opening at least partially defining a receptacle volume dimensioned to accommodate the wireless communication device therein;

a wall plate releasably connected to the first housing overlying the faceplate, a receptacle access opening being defined in the wall plate aligned with the receptacle opening, a radial dimension of the receptacle opening being smaller than a corresponding radial dimension of the receptacle opening, such that the wall plate is able to releasably retain the wireless communication device within the receptacle volume;

a wireless communication device audio output connector extending into the receptacle volume and configured for releasable connection to a wireless communication device audio output;

a wireless communication device power connector extending into the receptacle volume and configured for releasable connection to a wireless communication device power input;

an amplifier arranged within the first housing interior volume, the amplifier being configured to generate an amplified audio output from at least a first amplifier audio input, the first amplifier audio input being connected to the wireless communication device audio output connector;

an audio output connector located in the first housing connected to the amplified audio output and configured to connect to at least one external speaker; and at least one power connection connected to the amplifier and the wireless communication device power connector and configured to connect to a power source;

wherein a flange forms a periphery of the faceplate, the flange extending radially beyond a periphery of the faceplate so as to seat against a wall around a periphery of a wall opening with the first housing extending axially thereinto.

8. The in-wall amplifier assembly of claim 7, wherein a connection opening is defined in the receptacle sidewall, and the wireless communication device audio output connector and power connector extend therethrough.

9. The in-wall amplifier assembly of claim 8, wherein a receptacle endwall extends across at least a portion of an axial inner receptacle sidewall end.

10. The in-wall amplifier assembly of claim 7, wherein the receptacle sidewall includes a removable insert around a periphery thereof, such that a larger wireless communication device is accommodatable in the receptacle volume with the removable insert removed.

11. The in-wall amplifier assembly of claim 10, further comprising an alternate wall plate interchangeable with the wall plate, an alternate access opening being defined in the alternate wall plate aligned with the receptacle opening, a radial dimension of the alternate receptacle opening being larger than the radial dimension of the wall plate and smaller than a corresponding radial dimension of the receptacle opening with the removable insert removed, such that the alternate wall plate is able to releasably retain the larger wireless communication device within the device receptacle.

12. The in-wall amplifier assembly of claim 11, wherein radial dimensions of the first housing sidewall allow the first housing to be axially inserted within a double gang box.

13. The in-wall amplifier assembly of claim 7, further comprising:
a second housing connected to the first housing and defining a second housing interior volume and including a second housing sidewall extending between axial inner and outer second housing sidewall ends, a second housing axial inner and outer endwalls extending across the axial inner second housing sidewall ends, respectively; and
an alternating current (AC) power connection arranged in the second housing and configured to connect to an AC power source;
an AC/direct current (DC) adapter arranged in the second housing, the AC/DC adapter having an adapter input connected to the AC power connection and an adapter output;
wherein the adapter output supplies DC power to the at least one power connection.

14. The in-wall amplifier assembly of claim 13, wherein the second housing axial outer end is connected to the first housing axial inner end.

15. The in-wall amplifier assembly of claim 7, wherein the amplifier is further configured to generate an amplified audio output from a second amplifier audio input, the in-wall amplifier assembly further comprising an external audio input connector located in the first housing and connected to the second amplifier audio input and configured to connect to at least one external audio input.

16. The in-wall amplifier assembly of claim 15, wherein the amplifier further includes control electronics configured to automatically switch the amplified audio output to the first amplifier audio input when the wireless communication device audio output is detected.

17. An in-wall amplifier assembly for a wireless communication device comprising:
a first housing at least partially defining a first housing interior volume and including a first housing sidewall extending between axial inner and outer first housing sidewall ends and a faceplate at least partially covering the first housing axial outer end, a receptacle opening being defined in the faceplate with a receptacle sidewall extending axially into the first housing interior volume from the receptacle opening at least partially defining a receptacle volume dimensioned to accommodate the wireless communication device therein;
a wall plate releasably connected to the first housing overlying the faceplate, a receptacle access opening being defined in the wall plate aligned with the receptacle opening, a radial dimension of the receptacle opening being smaller than a corresponding radial dimension of the receptacle opening, such that the wall plate is able to releasably retain the wireless communication device within the receptacle volume;
a wireless communication device audio output connector extending into the receptacle volume and configured for releasable connection to a wireless communication device audio output;
a wireless communication device power connector extending into the receptacle volume and configured for releasable connection to a wireless communication device power input;
an amplifier arranged within the first housing interior volume, the amplifier being configured to generate an amplified audio output from at least a first amplifier audio input, the first amplifier audio input being connected to the wireless communication device audio output connector;
an audio output connector located in the first housing connected to the amplified audio output and configured to connect to at least one external speaker; and
at least one power connection connected to the amplifier and the wireless communication device power connector and configured to connect to a power source;
wherein a connection opening is defined in the receptacle sidewall, and the wireless communication device audio output connector and power connector extend therethrough; and
wherein a receptacle endwall extends across at least a portion of an axial inner receptacle sidewall end.

18. An in-wall amplifier assembly for a wireless communication device comprising:
a first housing at least partially defining a first housing interior volume and including a first housing sidewall extending between axial inner and outer first housing sidewall ends and a faceplate at least partially covering the first housing axial outer end, a receptacle opening being defined in the faceplate with a receptacle sidewall extending axially into the first housing interior volume from the receptacle opening at least partially defining a receptacle volume dimensioned to accommodate the wireless communication device therein;
a wall plate releasably connected to the first housing overlying the faceplate, a receptacle access opening being defined in the wall plate aligned with the receptacle opening, a radial dimension of the receptacle opening being smaller than a corresponding radial dimension of the receptacle opening, such that the wall plate is able to releasably retain the wireless communication device within the receptacle volume;
a wireless communication device audio output connector extending into the receptacle volume and configured for releasable connection to a wireless communication device audio output;
a wireless communication device power connector extending into the receptacle volume and configured for releasable connection to a wireless communication device power input;
an amplifier arranged within the first housing interior volume, the amplifier being configured to generate an amplified audio output from at least a first amplifier audio input, the first amplifier audio input being connected to the wireless communication device audio output connector;
an audio output connector located in the first housing connected to the amplified audio output and configured to connect to at least one external speaker; and
at least one power connection connected to the amplifier and the wireless communication device power connector and configured to connect to a power source;
wherein the receptacle sidewall includes a removable insert around a periphery thereof, such that a larger wireless communication device is accommodatable in the receptacle volume with the removable insert removed.

\* \* \* \* \*